United States Patent

Hinterschuster et al.

Patent Number: 5,538,609
Date of Patent: Jul. 23, 1996

[54] CATHODIC SPUTTERING SYSTEM

[75] Inventors: Reiner Hinterschuster, Hammersbach; Berthold Ocker, Hanau; Roland Gesche, Seligenstadt; Mark Saunders, Hörstein, all of Germany

[73] Assignee: Leybold Aktiengesellschaft, Hanau, Germany

[21] Appl. No.: 448,837

[22] Filed: May 24, 1995

[51] Int. Cl.$^6$ .................................. C23C 14/35
[52] U.S. Cl. ..................... 204/298.2; 204/298.07
[58] Field of Search ............... 204/298.07, 298.2

[56] References Cited

U.S. PATENT DOCUMENTS

| 4,444,643 | 4/1984 | Garrett | 204/298.2 |
| 4,714,536 | 12/1987 | Freeman et al. | 204/298.2 |
| 5,433,835 | 7/1995 | Demaray et al. | 204/298.09 |

FOREIGN PATENT DOCUMENTS

| 2707144 | 8/1977 | Germany | 204/298.2 |
| 4415232 | 11/1995 | Germany | 204/298.2 |
| 62-174375 | 7/1987 | Japan | 204/298.2 |
| WO90/13137 | 11/1990 | WIPO | 204/298.2 |

*Primary Examiner*—Aaron Weisstuch
*Attorney, Agent, or Firm*—Felfe & Lynch

[57] ABSTRACT

An evacuable chamber serving as a cathode contains a rotatable magnet system and is connected to a high frequency power supply for sputtering a target. The chamber is electrically isolated from an evacuable housing containing the substrate to be coated, the chamber being covered by a cup-like shield fixed to the housing to define an interior space. A pipe for evacuating the chamber includes first and second sections separated by a gap and connected by an electrically insulating collar in which parallel metal grids are installed in the gap and respectively connected to the power source and to ground in order to prevent the formation of secondary plasma.

2 Claims, 1 Drawing Sheet

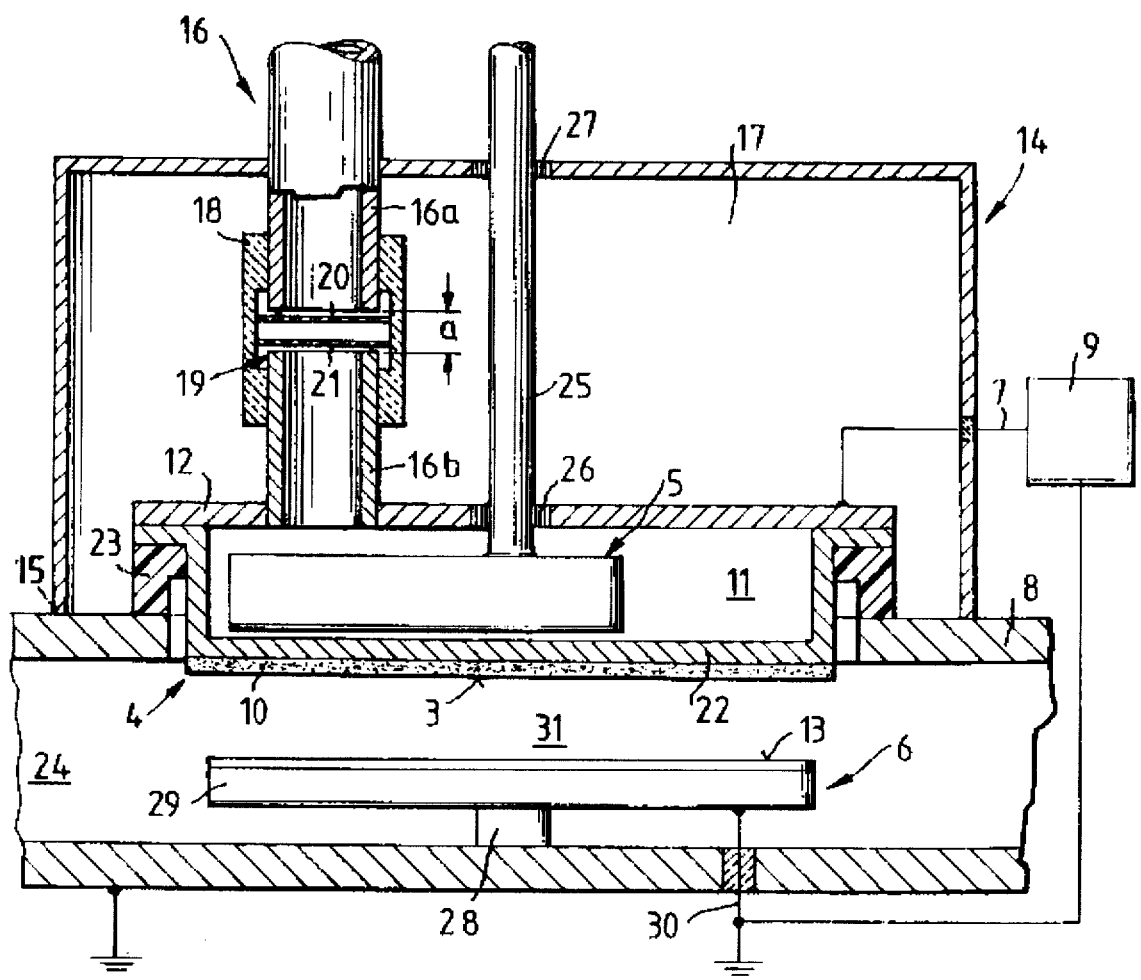

CATHODIC SPUTTERING SYSTEM

BACKGROUND OF THE INVENTION

The invention pertains to a cathodic sputtering system with a cathode carrying a target surface to be sputtered; a source of high frequency energy connected to the cathode; and a magnet assembly near the cathode, on the side facing away from the surface to be sputtered. This assembly generates lines of magnetic force, which essentially enter the surface to be sputtered and emerge from it again to form a tunnel-shaped region over a path to be sputtered on the surface of the target. The anode is formed by the substrate to be coated and is located opposite the cathode. The surface to be sputtered and the magnetic device are installed inside an evacuable housing, the magnet assembly being supported so that it can move relative to the cathode under the action of a drive mechanism, the path of the magnets traveling over the surface to be sputtered during one of the cycles of movement.

U.S. Pat. No. 4,444,643 discloses a magnet assembly in a planar magnetron cathode which can be moved around a circular path with respect to the target, for which purpose the magnets are connected non-rotatably to a shaft, which is perpendicular to the surface of the target and driven by a motor. The chamber in which the magnet assembly rotates is sealed off from the outside by a cover, which is made of electrically insulating material, preferably of plastic, while the chamber itself is under atmospheric pressure.

DE-A 2707144 discloses a magnet assembly which can be moved back and forth with respect to a planar target in a plane parallel to the target. In this case, too, the magnet assemblies are installed outside the process chamber and are subject to atmospheric pressure.

DE 44 15 232 discloses a coating system in which a sputter cathode, provided with a set of magnets, is installed inside a coating chamber. The cathode has an electrode connected to negative potential with a set of magnets. A target constituting the material to be sputtered is mounted on the side of the electrode facing away from the set of magnets; on the side of the electrode facing away from the target, a pressure equalization chamber is provided, which has a vacuum connection for creating a negative pressure to counter the negative pressure in the coating chamber.

SUMMARY OF THE INVENTION

The task of the present invention is to improve the advantages of known magnetron cathodes with movable sets of magnets in such a way that the cathodes are suitable in particular for coating very large substrates with electrically insulating materials and especially in cases where strict requirements are imposed on the uniformity and homogeneity of the layer.

In accordance with the invention, the chamber wall enclosing the magnet assembly and the housing carrying the target are mounted in such a way that they are kept electrically insulated, where the cathode, on the side facing away from the anode, is surrounded by a cup-shaped shield, the peripheral edge of which rests tightly on the outside wall of the housing. The chamber is connected to a vacuum source by way of a pipeline, which passes through the free inside space of the shield cup and is divided by an insulating collar into two sections, two parallel metal grids being installed in the gap formed between the two sections, this gap acting as a dark space. One of the grids is grounded together with the shield, while the other grid is connected by way of the other section of pipe to the high-frequency source, with the result that no secondary plasmas are ignited.

BRIEF DESCRIPTION OF THE DRAWINGS

The sole figure is a longitudinal cross section through a diode assembly for high-frequency sputtering with a moving magnet assembly and a shield cup.

DETAILED DESCRIPTION OF THE DRAWINGS

The cathodic sputtering system consists essentially of an evacuable housing 8; a cathode 4, carrying a target 10, installed in a cut-out in the housing wall; a target backplate 22; a magnet assembly 5; a chamber wall 12, which seals off chamber 11 on the side of backplate 22 facing away from target 10; a ring 23, which electrically insulates backplate 22 with respect to housing wall 28; and a pipe 16, which connects chamber 11 to a vacuum source, the pipe consisting of a first section 16a and a second section 16b connected to each other by way of a collar 18 of electrically insulating material. Section 16b is separated from the other section 16a by a distance which "a" corresponds to the dark space distance (about 2–3 mm). This gap is large enough to accept the installation of parallel first and second metal grid plates 20, 21. One of these grids, i.e., grid 21, is connected electrically to pipe 16b, while the opposite grid 20 is connected to pipe 16a and therefore grounded, so that no secondary plasma can develop at this point. In chamber 11 formed by backplate 22 and wall section 12, a magnet assembly 5 is mounted on a motor-driven shaft 25 supported in bearings 26, 27. Shaft 25 is made of insulating material to prevent an electrical connection from being established between cup-shaped shield 14, which is connected to grounded housing 8, and cathode 4, which is at high frequency. Cathode 4 and target 10 are installed in housing 8 opposite substrate holder 28 with substrate plate 29 and substrate 13. Substrate plate 29 is connected to ground wire 30, whereas metal chamber wall 12 is connected by line 7 to high-frequency source 9. Backplate 22, which is supported on insulating ring 23, and wall section 12 form together an evacuable chamber 11, which provides the advantage that target 10 is prevented from sagging under any conditions, because the pressure difference between coating space 31 and chamber 11 can be kept very small. It is also possible to use a comparatively large, thin target 10, without the danger that the target will be damaged as a result of deformation under pressure. In particular, there is no difficulty in using a target which has been assembled from several pressure-sensitive parts, because the bottom part of backplate 22 will not bow or become deformed during the sputtering process even if it is relatively thin.

We claim:

1. Magnetron cathode sputtering apparatus for coating a substrate, said apparatus comprising an evacuable housing containing an anode for holding a substrate to be coated, an evacuable chamber comprising a chamber wall and a cathode bearing a target to be sputtered, said target facing said anode, said chamber being electrically insulated from said housing, a high frequency power supply connected to said chamber, a magnet assembly inside said chamber for generating magnetic lines of force over said target, said magnet assembly being movable relative to said target, a cup-like shield fixed tightly against said housing and defining an inside space over said evacuable chamber, said shield being at ground potential, a pipe for evacuating said chamber passing through said inside space, said pipe comprising a first section at like potential as said shield and a second section at like potential as said chamber, said first section being separated from said second section by a gap which acts as a dark space, said pipe further comprising an insulating collar surrounding said gap, and parallel first and second metal grids in said gap, said first grid being electrically connected to said first pipe section, said second grid being electrically connected to said second pipe section.

2. Apparatus as in claim 1 further comprising a drive shaft of electrically insulating material passing through said shield and through said chamber wall to rotate said magnet assembly inside said chamber.

* * * * *